(12) United States Patent
Suzuki et al.

(10) Patent No.: US 8,367,999 B2
(45) Date of Patent: Feb. 5, 2013

(54) SOLID STATE IMAGING DEVICE COMPRISING DUMMY REGIONS EACH CONTAINING A MULTIPLICATION REGISTER AND AN AMPLIFIER

(75) Inventors: Hisanori Suzuki, Hamamatsu (JP); Yasuhito Yoneta, Hamamatsu (JP); Shin-ichiro Takagi, Hamamatsu (JP); Kentaro Maeta, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 304 days.

(21) Appl. No.: 12/920,142

(22) PCT Filed: Jan. 22, 2010

(86) PCT No.: PCT/JP2010/050777
§ 371 (c)(1),
(2), (4) Date: Sep. 20, 2010

(87) PCT Pub. No.: WO2010/087278
PCT Pub. Date: Aug. 5, 2010

(65) Prior Publication Data
US 2011/0031377 A1 Feb. 10, 2011

(30) Foreign Application Priority Data
Jan. 30, 2009 (JP) .............................. P2009-020457

(51) Int. Cl.
*H01L 27/00* (2006.01)
(52) U.S. Cl. .............. 250/208.1; 250/214 DC; 348/294; 348/302; 348/311

(58) Field of Classification Search ............... 250/208.1, 250/214.1, 214 R, 214 DC; 257/431, 432; 348/272, 281, 282, 294, 302, 303, 304, 311, 348/322, 323
See application file for complete search history.

(56) References Cited

U.S. PATENT DOCUMENTS

| 5,337,340 A | 8/1994 | Hynecek |
| 6,278,142 B1 | 8/2001 | Hynecek |
| 6,444,968 B1 | 9/2002 | Burt et al. |

(Continued)

FOREIGN PATENT DOCUMENTS

| EP | 0379371 | 7/1990 |
| EP | 0 866 501 A1 | 9/1998 |
| EP | 1 152 469 A2 | 11/2001 |

(Continued)

*Primary Examiner* — Francis M Legasse, Jr.
(74) *Attorney, Agent, or Firm* — Drinker Biddle & Reath LLP

(57) ABSTRACT

A multi-port solid-state imaging device of one embodiment includes an imaging region and a plurality of units. The imaging region contains a plurality of pixel columns. The units are arrayed in a direction in which the pixel columns are arrayed, and generate signals based on charges from the imaging region. Each unit has an output register, a multiplication register, and an amplifier. The output register transfers a charge from one or more corresponding pixel columns. The multiplication register receives the charge from the output register to generate a multiplied charge. The amplifier generates a signal based on the multiplied charge from the multiplication register. The solid-state imaging device contains a region where the units are provided, and a first dummy region and a second dummy region located on both sides in the above-mentioned direction of the region. In each of the first dummy region and the second dummy region, a multiplication register and an amplifier are provided.

1 Claim, 2 Drawing Sheets

U.S. PATENT DOCUMENTS

| | | |
|---|---|---|
| 6,862,333 B2 | 3/2005 | Kashima et al. |
| 7,190,400 B2 | 3/2007 | Hynecek |
| 7,291,821 B2 | 11/2007 | Robbins |
| 7,420,605 B2 | 9/2008 | Pool et al. |
| 2004/0037105 A1* | 2/2004 | Barna et al. .................. 365/94 |
| 2005/0029553 A1 | 2/2005 | Hynecek |
| 2006/0163503 A1 | 7/2006 | Urano et al. |
| 2006/0186363 A1* | 8/2006 | Hazelwood et al. .......... 250/580 |
| 2007/0146521 A1 | 6/2007 | Robbins |
| 2008/0137801 A1 | 6/2008 | Hadfield |
| 2011/0069213 A1* | 3/2011 | Aoki ............................ 348/302 |

FOREIGN PATENT DOCUMENTS

| | | |
|---|---|---|
| EP | 1 781 025 A1 | 5/2007 |
| JP | 9-186937 | 7/1997 |
| JP | 10-304256 | 11/1998 |
| JP | 2000-299818 | 10/2000 |
| JP | 2001-119010 | 4/2001 |
| JP | 2006-201044 | 8/2006 |
| JP | 3862850 | 10/2006 |
| JP | 2007-124675 | 5/2007 |
| KR | 10-0298039 | 10/2001 |

* cited by examiner

SOLID STATE IMAGING DEVICE COMPRISING DUMMY REGIONS EACH CONTAINING A MULTIPLICATION REGISTER AND AN AMPLIFIER

TECHNICAL FIELD

The present invention relates to a multi-port type and charge multiplying type of solid-state imaging device.

BACKGROUND ART

Among solid-state imaging device, there are multi-port and charge multiplying solid-state imaging devices described in the following Patent Literature 1 and Patent Literature 2. Such solid-state imaging devices include an imaging region and a plurality of units. The imaging region contains a plurality of pixel columns. Bach of the units has an output register that transfers a charge from one or more corresponding pixel columns out of the pixel columns, a multiplication register that receives a charge transferred by the output register to generate a multiplied charge, and an amplifier that generates a signal based on a multiplied charge from the multiplication register.

CITATION LIST

Patent Literature

Patent Literature 1: Japanese Patent Laid-Open No. 2007-124675
Patent Literature 2: Japanese Patent No. 3862850

SUMMARY OF INVENTION

Technical Problem

The gain of a charge multiplying solid-state imaging device fluctuates depending on the temperature. Moreover, it is desired from a multi-port and charge multiplying solid-state imaging devices to reduce a difference in gain in all units. The solid-state imaging device disclosed in Patent Literature 2 can control the multiplication register in multiplication factor, and is thus capable of controlling the gain of each port so as to reduce a difference in gain in all ports. However, a circuit configuration for controlling the gain is complicated.

It is an object of the present invention to provide a multi-port and charge multiplying solid-state imaging device that outputs from a plurality of units signals based on charges from an imaging region, and that is capable of reducing a difference in gain among the units with a simple configuration.

Solution to Problem

A solid-state imaging device of the present invention is a multi-port solid-state imaging device, and includes an imaging region and a plurality of units. The imaging region contains a plurality of pixel columns. The units are for generating a signal based on a charge from the imaging region, and arrayed in a direction in which the pixel columns are arrayed. Each of the units has an output register, a multiplication register, and an amplifier. The output register transfers a charge from one or more corresponding pixel columns out of the pixel columns. The multiplication register receives the charge from the output register to generate a multiplied charge. The amplifier generates a signal based on the multiplied charge from the multiplication register. The present solid-state imaging device contains a region where the units are provided, and a first dummy region and a second dummy region located on both sides in the above-mentioned direction of said region. In each of the first dummy region and the second dummy region, a multiplication register and an amplifier are provided.

In a conventional multi-port and charge multiplying solid-state imaging device, the other units exist on both sides of units other than the units located at both ends of a plurality of units, but with regard to the units at both ends, one unit solely exists at one side thereof. Generally, the gain in each unit greatly fluctuates depending on the temperature of that unit. Moreover, heat generating elements such as an amplifier and a multiplication register are included in each unit. Therefore, in the conventional multi-port and charge multiplying solid-state imaging device, there is a difference produced between the temperature of the units at both ends and the temperature of other units. Hence, in the conventional multi-port and charge multiplying solid-state imaging device, it has been difficult to unify the gain among the units.

On the other hand, according to the solid-state imaging device of the present invention, the multiplication register and the amplifier are provided near two units located at both ends of the multiple units. Therefore, the difference between the temperature of the two units located at both ends and the temperature of other units is reduced. Consequently, the difference in gain among the units is reduced.

Advantageous Effects of Invention

As has been described above, according to the present invention, a multi-port and charge multiplying solid-state imaging device that outputs from a plurality of units signals based on charges from an imaging region, and that is capable of reducing a difference in gain among the units with a simple configuration is provided.

DESCRIPTION OF EMBODIMENTS

Figure 1:
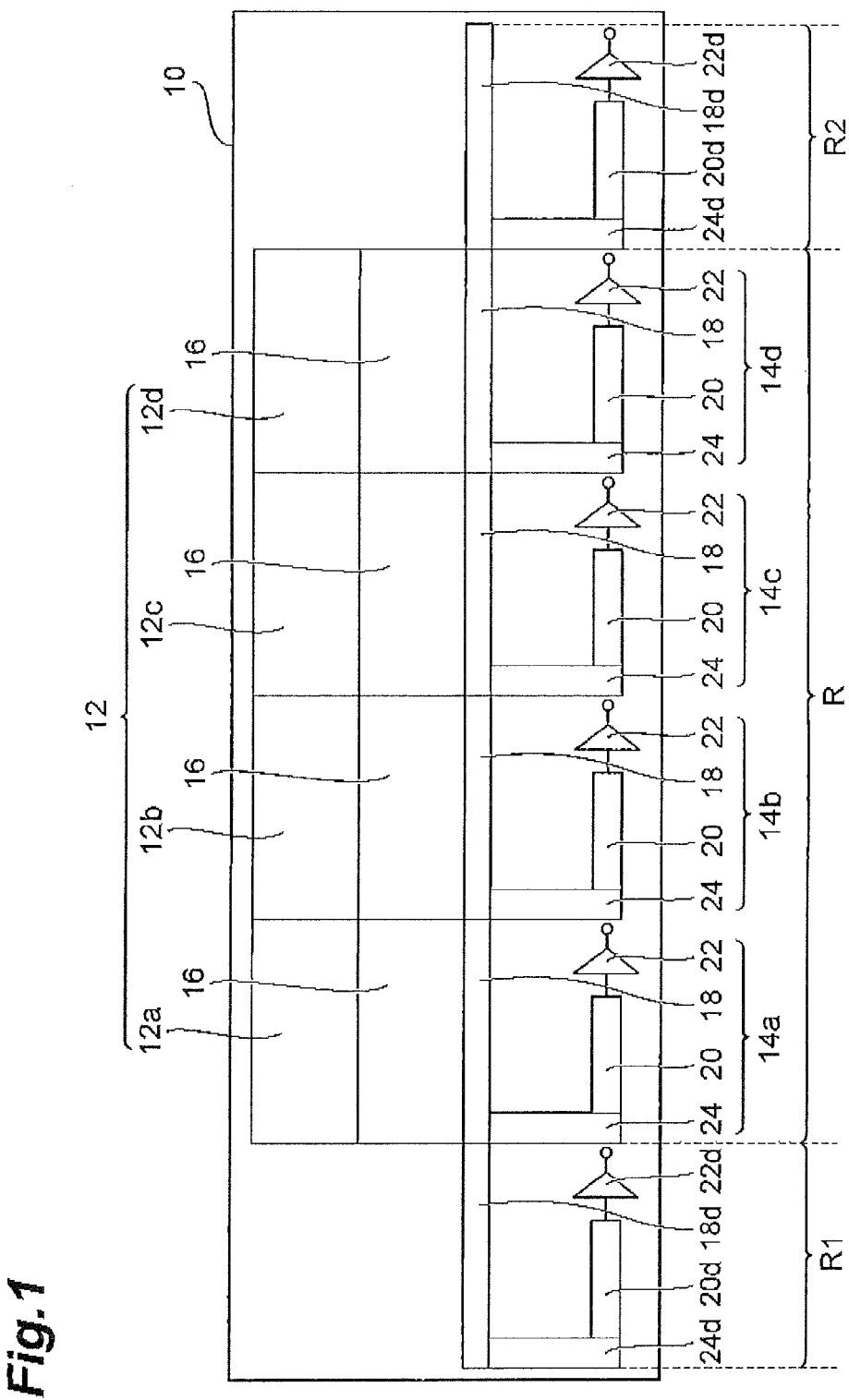
FIG. 1 is a view showing a solid-state imaging device according to an embodiment.

Hereinafter, a preferred embodiment of the present invention will be described in detail with reference to the drawings. Also, the same or corresponding parts will be denoted with the same reference numerals in the drawings.

FIG. 1 is a view showing a solid-state imaging device according to an embodiment. The solid-state imaging device 10 shown in FIG. 1 includes an imaging region 12, and a plurality of units 14a to 14d. In the following description, the units 14a to 14d may be collectively referred to as units 14.

The imaging region 12 is a region that generates charges in response to incident light. Specifically, the imaging region 12 includes a plurality of pixel arrayed two-dimensionally, and each pixel includes a photodiode.

The solid-state imaging device 10 of the present embodiment includes charge accumulating regions 16 as well as the imaging region 12. The charge accumulating region 16 is a section that temporarily accumulates charges generated by the imaging region 12 before transferring the charges to output registers described later. The solid-state imaging device 10 having such charge accumulating regions 16 is called a frame transfer CCD image sensor. However, the solid-state imaging device of the present invention may be an interline CCD image sensor or a full-frame transfer CCD image sensor.

The imaging region 12 has a plurality of areas 12a to 12d. The areas 12a to 12d are arranged in the horizontal direction, and a plurality of pixel columns are included in each area. Charges generated by the areas 12a to 12d are output to corresponding units 14. In addition, the imaging region 12 of the solid-state imaging device 10 contains four areas, that is, the solid-state imaging device 10 is a 4-port solid-state imaging device, but the number of ports of the solid-state imaging device of the present invention is not limited to four.

Each of the units 14a to 14d has an output register 18, a multiplication register 20, and an amplifier 22. In the present embodiment, each of the units 14a to 14d further may include a corner register 24.

The output register 18 is a transfer register that receives a charge generated by a corresponding area of the imaging region 12 and then transferred in the vertical direction to transfer the charge in the horizontal direction. The corner register 24 is a transfer register that transfers a charge like the output register 18. The corner register 24 is provided between the output register 18 and the multiplication register 20. The corner register 24 transfers a charge transferred by the output register 18 to the multiplication register 20.

The multiplication register 20 is a register that multiplies a charge by an impact ionization effect, and transfers the multiplied charge. In the solid-state imaging device 10, the multiplication register 20 receives via the corner register 24 a charge transferred from the output register 18, and outputs a multiplied charge to the amplifier 22.

The amplifier 22 receives a charge multiplied by the multiplication register 20 to perform charge-voltage conversion, and generates a signal according to the amount of charge. As the amplifier 22, a floating diffusion (FD) amplifier may be used.

The present solid-state imaging device 10 contains a region R, first dummy region R1, and a second dummy region R2. The region R is a region where the multiple units 14a to 14d are provided. The first dummy region R1 and the second dummy region R2 exist on both sides of the region R in the same direction (horizontal direction) as the charge transferring direction of the output register 18.

The solid-state imaging device 10 includes a dummy multiplication register 20d and a dummy amplifier 22d in each of the first dummy region R1 and the second dummy region. R2. The dummy multiplication register 20d and the dummy amplifier 22d are elements the same as the multiplication register 20 and the amplifier 22, respectively.

Further, in the solid-state imaging device 10, a dummy output register 18d and a dummy corner register 24d may be provided in each of the first dummy region R1 and the second dummy region R2. The dummy output register 18d and the dummy corner register 24d are elements the same as the output register 18 and the corner register 24, respectively.

Figure 2:
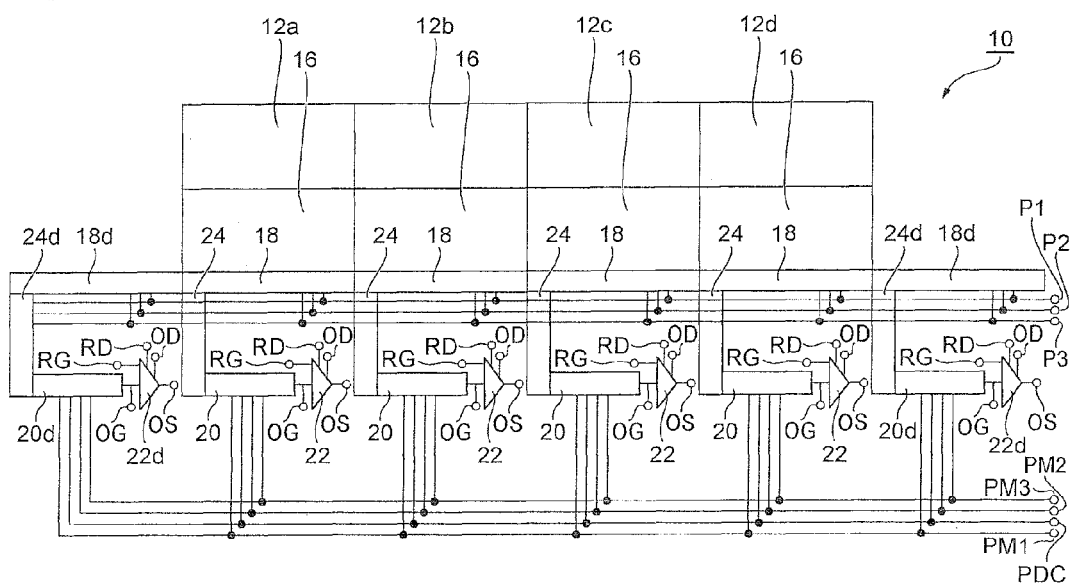
FIG. 2 is a view showing with wiring the solid-state imaging device shown in FIG. 1.

Hereinafter, the electrical connection relationship of the solid-state imaging device 10 will be described with reference to FIG. 2. FIG. 2 is a view showing with wiring the solid-state imaging device 10 shown in FIG. 1. As shown in FIG. 2, the solid-state imaging device 10 is a three-phase drive solid-state imaging device, and has terminals P1 to P3, PM1 to PM3, and PDC.

The terminals P1 to P3 are terminals for inputting 3-phase clock signals to the output registers 18 and the corner registers 24 of all units 14a to 14d. The wirings extending from the terminals P1 to P3 are common to the output registers 18 and the corner registers 24 of all units 14a to 14d, and connected to the output registers 18 and the corner registers 24 of all units 14a to 14d. As a result of being supplied with 3-phase clock signals from the terminals P1 to P3, the output registers 18 and the corner registers 24 transfer charges, respectively. Further, the wirings extending from these terminals P1 to P3 are also common to the dummy output registers 18d and the dummy corner registers 24d, and also connected to the dummy output registers 18d and the dummy corner registers 24d.

The terminals PM1 to PM3 are terminals for inputting 3-phase clock signals to the multiplication registers 20 of all units 14a to 14d. Moreover, the terminal PDC is a terminal to which a DC voltage is input for forming a barrier on the multiplication registers 20. The wirings extending from the terminals PM1 to PM3 and PDC are common to the multiplication registers 20 of all units 14a to 14d, and connected to the multiplication registers 20 of all units 14a to 14d. Further, the wirings extending from these terminals PM1 to PM3 and PDC are also common to the dummy multiplication registers 20d, and also connected to the multiplication registers 20d.

Each of the amplifiers 22 and 22d has a reset gate terminal RG, a reset drain terminal RD, an output drain terminal OD, and an output source terminal OS. Moreover, between an FD region of the amplifiers 22, 22d and the last stage of the multiplication register 20, an output gate terminal OG is provided.

The terminal RG is a terminal for supplying a reset pulse to the gates of a reset transistor in the amplifiers 22, 22d. As a result of a reset pulse being supplied to the terminal RG, a charge accumulated in the FD region is discharged from the terminal RD connected to the drain of the reset transistor. To the terminals RD and OD, a predetermined supply voltage is supplied. To the terminal OG, an ON signal is supplied when transferring a charge from the multiplication register. Accordingly, the charge from the multiplication register is transferred to the FD region. From the terminal OS, an amplified signal is output.

In the present solid-state imaging device 10, the same terminals of the amplifiers 22 and 22d are supplied with the same signals, but the wirings are not in common in order to prevent crosstalk between adjacent amplifiers.

In the solid-state imaging device 10 described above, the multiplication register 20d and the amplifier 22d are provided in each of the first dummy region R1 and the second dummy region R2 located near the units 14a and 14d at both ends of the multiple units 14a to 14d. In addition, signals are supplied also to the multiplication register 20d and the amplifier 22d like the multiplication register 20 and the amplifier 22 of the units 14a to 14d. Accordingly, the multiplication register 20d and the amplifier 22d generate heat like the multiplication register 20 and the amplifier 22. Therefore, the difference between the temperature of the units 14a and 14d at both ends and the temperature of other units 14b and 14c is reduced. Hence, in the solid-state imaging device 10, the difference in gain among the units 14a to 14d is reduced.

It should be noted that the present invention is not limited to the present embodiment described above, and can be variously modified. For example, the solid-state imaging device of the present invention may not have the dummy output registers and dummy corner registers. This is because heat generation by the output register and corner register is small relative to that of the multiplication register and amplifier. Moreover, the solid-state imaging device of the present invention is not limited to a three-phase drive solid-state imaging device, and can adopt various drive systems such as, for example, four-phase drive.

Reference Signs List

10 . . . Solid-state image imaging device, 12 . . . Imaging region, 14a to 14d . . . Unit, 16 . . . Charge accumulating region, 18 . . . Output register, 18d . . . Output register (dummy), 20 . . . Multiplication register, 20d . . . Multiplication register (dummy), 22 . . . Amplifier, 22d . . . Amplifier (dummy), 24 . . . Corner register, 24d . . . Corner register (dummy), OD . . . Output drain terminal, OG . . . Output gate terminal, OS . . . Output source terminal, RD . . . Reset drain terminal, RG . . . Reset gate terminal, P1 to P3 . . . Terminal, PDC . . . Terminal, PM1 to PM3 . . . Terminal, R Region, R1 . . . First dummy region, R2 . . . Second dummy region.

The invention claimed is:
1. A multi-port solid-state imaging device comprising:
an imaging region containing a plurality of pixel columns; and
a plurality of units that generate signals based on a charges from the imaging region, said units being arrayed in a direction in which the pixel columns are arrayed,
each of the units having:
an output register that transfers a charge from one or more corresponding pixel columns out of the plurality of pixel columns;
a multiplication register that receives the charge from the output register to generate a multiplied charge; and
an amplifier that generates a signal based on the multiplied charge from the multiplication register,
wherein the solid-state imaging device
further comprises a region in which the units are provided, and first dummy region and a second dummy region located on both sides in the direction of said region, and
further comprises, in each of the first dummy region and the second dummy region, a multiplication register and an amplifier.

* * * * *